(12) United States Patent  
Wada

(10) Patent No.: US 8,093,785 B2
(45) Date of Patent: Jan. 10, 2012

(54) PIEZOELECTRIC RESONATOR, PIEZOELECTRIC OSCILLATOR, ELECTRONIC DEVICE AND METHOD FOR MANUFACTURING PIEZOELECTRIC RESONATOR

(75) Inventor: Mitsuhiro Wada, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/722,831

(22) Filed: Mar. 12, 2010

(65) Prior Publication Data

US 2010/0244630 A1  Sep. 30, 2010

(30) Foreign Application Priority Data

Mar. 26, 2009  (JP) .................................. 2009-076055

(51) Int. Cl.
*H01L 41/08* (2006.01)

(52) U.S. Cl. .................. 310/340; 310/348; 310/344

(58) Field of Classification Search .................. 310/340, 310/345, 346
See application file for complete search history.

(56) References Cited

U.S. PATENT DOCUMENTS

| | | | | |
|---|---|---|---|---|
| 4,959,993 A | * | 10/1990 | Komurasaki | .................. 310/329 |
| 7,427,823 B2 | * | 9/2008 | Ohshima et al. | .............. 310/344 |
| 2002/0084723 A1 | * | 7/2002 | Kawazoe | ...................... 310/348 |
| 2005/0046310 A1 | * | 3/2005 | Kobayashi et al. | ........... 310/328 |
| 2006/0170305 A1 | | 8/2006 | Ohshima et al. | |

FOREIGN PATENT DOCUMENTS

JP  2006-217253  8/2006

* cited by examiner

*Primary Examiner* — Mark Budd
(74) *Attorney, Agent, or Firm* — Harness, Dickey & Pierce, P.L.C.

(57) ABSTRACT

A piezoelectric resonator includes: a package having a cavity; a plurality of electrode pads formed within the cavity; a first bonding section and a second bonding section that include silicone base conductive adhesive and are formed on the plurality of the electrode pads, respectively; and a piezoelectric vibrating element having one end supported by the first bonding section and the second bonding section, wherein the piezoelectric vibrating element has a piezoelectric substrate having mutually opposing first face and second face, a first electrode that is formed on the first face and electrically connected to the first bonding section, and a second electrode that is formed on the second face and electrically connected to the second bonding section, wherein an area of the piezoelectric vibrating element supported by the first bonding section and the second bonding section defines a supported region and an area of the piezoelectric vibrating element that is not supported by the first bonding section or the second bonding section defines a movable region, wherein a fluorocarbon resin film is formed on the movable region.

16 Claims, 8 Drawing Sheets

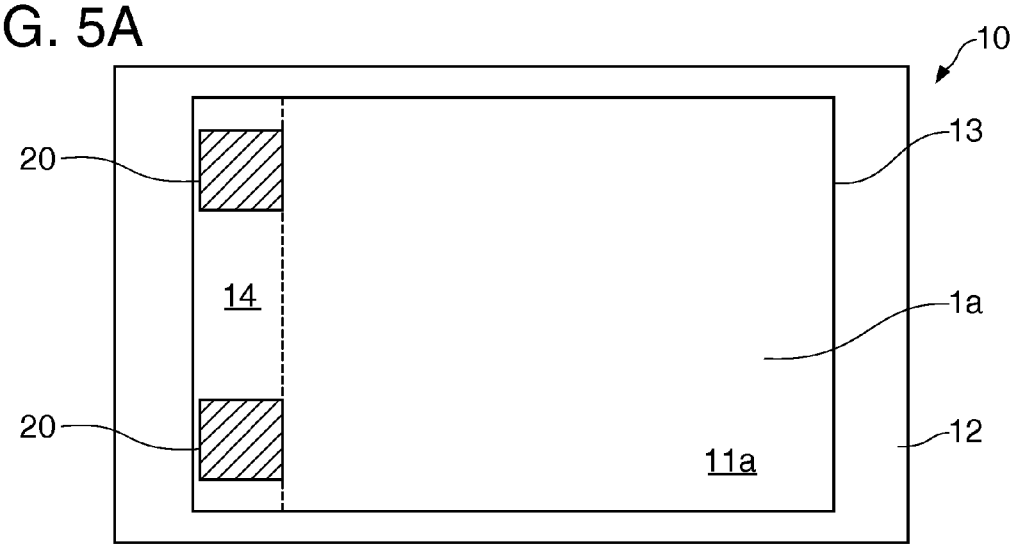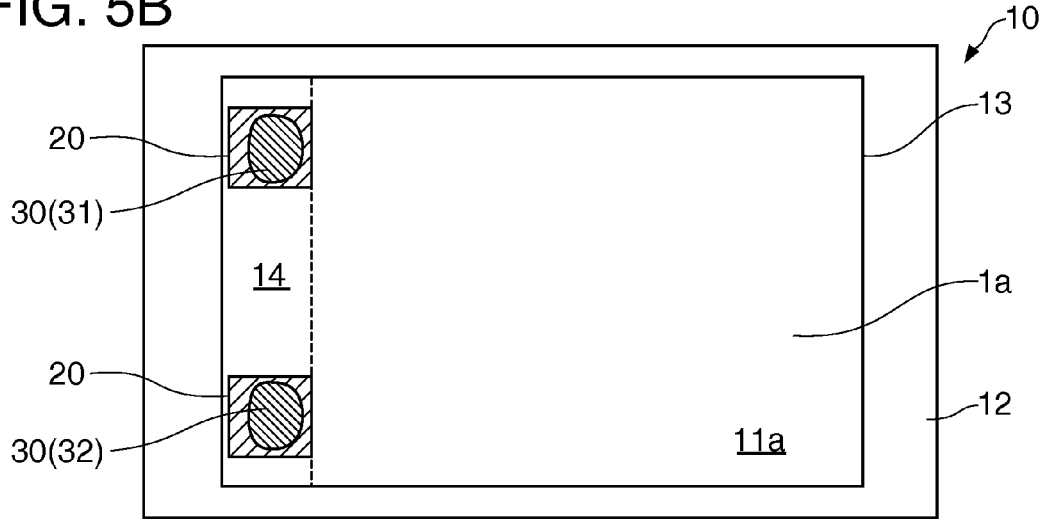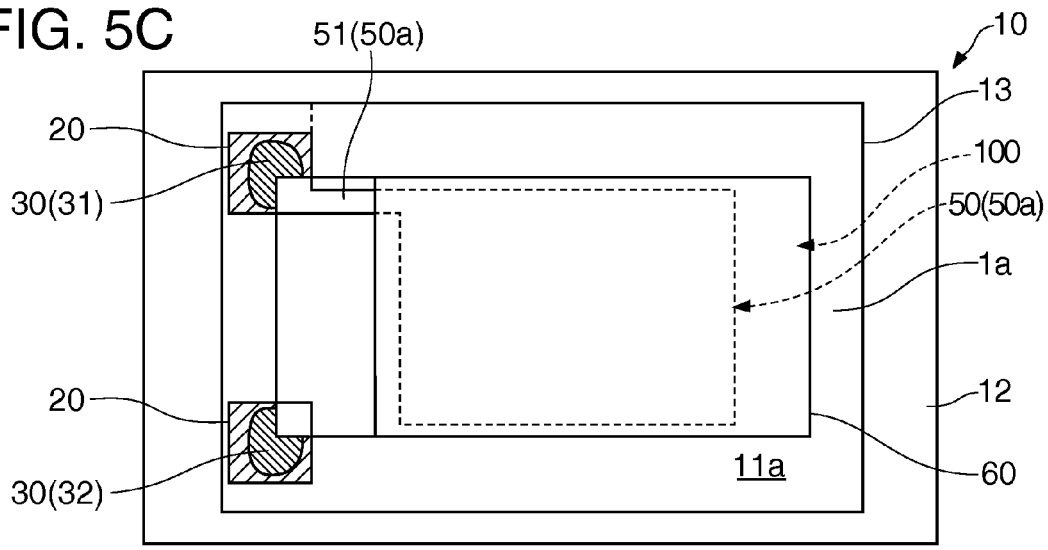

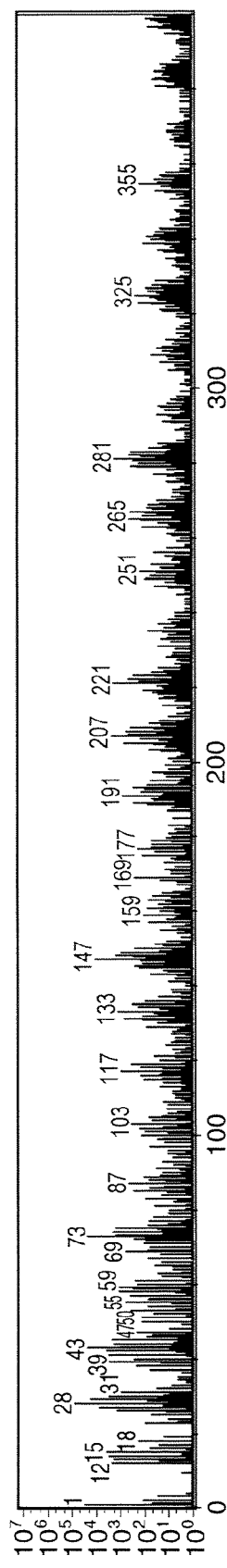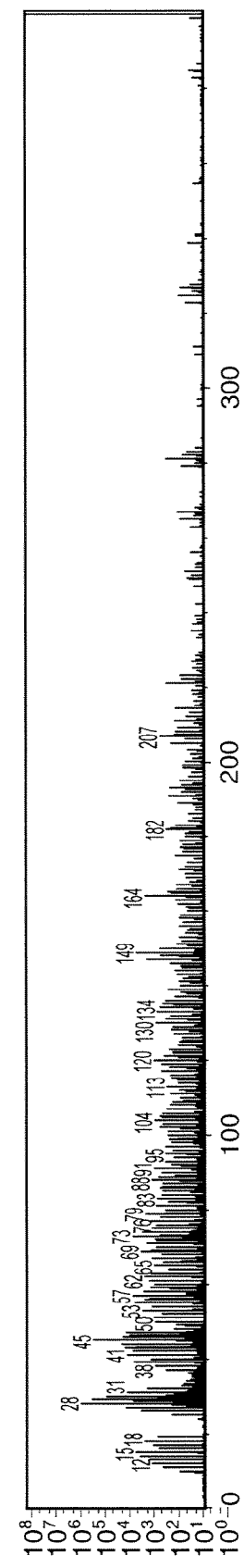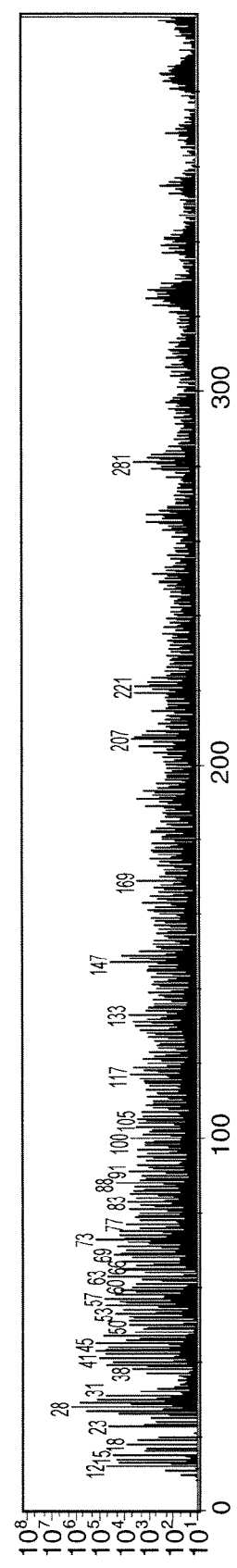

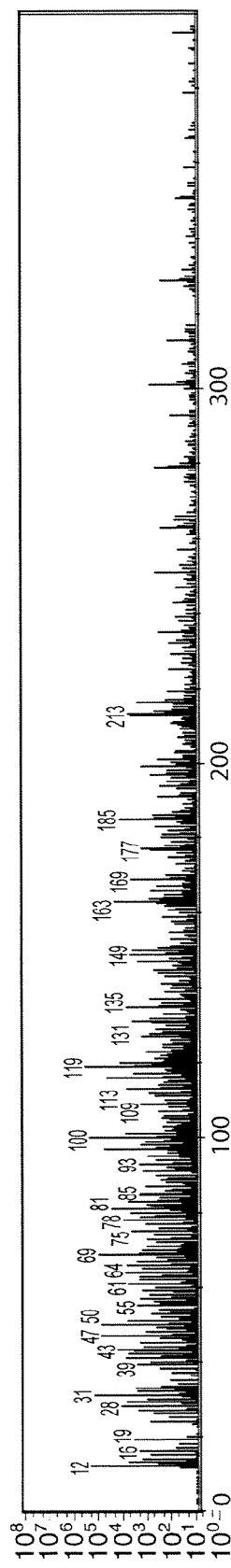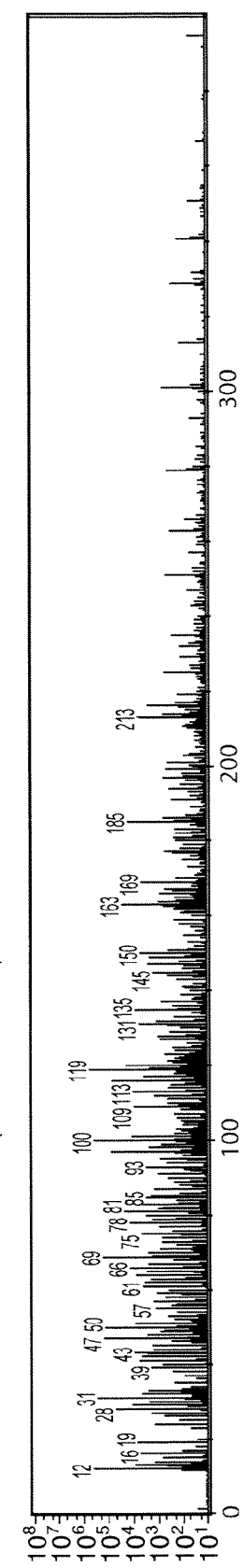

PIEZOELECTRIC RESONATOR, PIEZOELECTRIC OSCILLATOR, ELECTRONIC DEVICE AND METHOD FOR MANUFACTURING PIEZOELECTRIC RESONATOR

The entire disclosure of Japanese Patent Application No. 2009-076055, filed Mar. 26, 2009 is expressly incorporated by reference herein.

BACKGROUND

1. Technical Field

The present invention relates to piezoelectric resonators, piezoelectric oscillators, electronic devices and methods for manufacturing piezoelectric resonators.

2. Related Art

A piezoelectric resonator that uses a piezoelectric vibrating element having thickness shear vibration as its main vibration, such as, an AT-cut quartz resonator is known (see Patent Document JP-A-2006-217253). Piezoelectric devices such as piezoelectric resonators are used in piezoelectric oscillators that are mounted, for example, on information communication devices such as cellular phones and electronic apparatuses such as computers. In this piezoelectric device, a beam-like piezoelectric vibrating element is supported within a piezoelectric device in a cantilever manner, using silicone-base conductive adhesive. The piezoelectric vibrating element is air-tightly sealed, for example, within a cavity that may be vacuum sealed during its manufacturing process. This is conducted for the purpose of protecting the piezoelectric device from external frequency disturbing factors such as dusts after shipping out from the piezoelectric device manufacturer, so as to maintain the resonance frequency at the time of shipping.

However, it has been reported that a frequency lowering phenomenon occurs with time in such a piezoelectric device after the device has been shipped out from the piezoelectric device manufacture and implemented into a product (see Patent Document JP-A-2006-217253). According to the Patent Document JP-A-2006-217253, the frequency lowering phenomenon occurring with time is caused by the fact that cyclic dimethylpolysiloxanes molecular components (hereafter called as "dimethylsiloxanes") of silicone molecules evaporated from the silicone resin of the hardened silicone-base conductive adhesive are chemically adsorbed to the surface of the piezoelectric vibrating element within the cavity after shipping, thereby causing an increase in the mass of the piezoelectric vibrating element.

The silicone-base conductive adhesive that becomes a generation source of dimethylsiloxanes is very useful as it meets the demand for shock resistance, and it is therefore currently difficult to replace silicone-base conductive adhesive with other types of adhesive. Furthermore, in recent years, due to the demands for smaller and higher frequency piezoelectric devices, package bodies of piezoelectric resonators have been reduced in size, and the frequency band of resonance frequencies to be used has become higher, and therefore a possibility in that even a small increase in the mass of the piezoelectric vibrating element could lower the reliability of the resonance frequency of the piezoelectric vibrating element has been pointed out. Therefore, it is desired to provide piezoelectric resonators, whose resonance frequency is stable with time, and that are highly reliable.

SUMMARY

In accordance with an aspect of the invention, a piezoelectric resonator having a long-term high reliability can be provided.

In accordance with another aspect of the invention, a method for manufacturing a piezoelectric resonator having a long-term high reliability can be provided.

In accordance with still another aspect of the invention, a piezoelectric oscillator having the aforementioned piezoelectric resonator can be provided.

In accordance with yet another aspect of the invention, an electronic apparatus having the aforementioned piezoelectric oscillator can be provided.

(1) In accordance with an embodiment of the invention, a piezoelectric resonator includes: a package having a cavity; a plurality of electrode pads formed within the cavity; a first bonding section and a second bonding section that include silicone base conductive adhesive and are formed on the plurality of the electrode pads, respectively; and a piezoelectric vibrating element having one end supported by the first bonding section and the second bonding section, wherein the piezoelectric vibrating element has a piezoelectric substrate having mutually opposing first face and second face, a first electrode film that is formed on the first face and electrically connected to the first bonding section, and a second electrode film that is formed on the second face and electrically connected to the second bonding section, wherein an area of the piezoelectric vibrating element supported by the first bonding section and the second bonding section defines a supported region and an area of the piezoelectric vibrating element that is not supported by the first bonding section or the second bonding section defines a movable region, wherein a fluorocarbon resin film is formed on the movable region.

In the description of the invention, the term "above" is used, for example, as in a statement "a specific component (hereinafter called 'B') is formed "above" another specific component (hereinafter called 'A')." In such a case, the term "above" is used in the description of the invention, while assuming to include the case where the component B is formed directly on the component A and the case where the component B is formed over the component A through another component provided on the component A. Similarly, the term "below" is assumed to include the case where the component B is formed below and directly on the component A, and the case where the component B is formed below the component A through another component.

According to the invention, a piezoelectric resonator having a long-term high reliability can be provided.

(2) In the piezoelectric resonator in accordance with an aspect of the invention, the piezoelectric substrate may be a quartz substrate.

(3) In the piezoelectric resonator in accordance with an aspect of the invention, the fluorocarbon resin film may be formed, within the movable region, in a manner to cover at least a region where the piezoelectric vibrating element vibrates.

(4) In the piezoelectric resonator in accordance with an aspect of the invention, the fluorocarbon resin film may be formed, within the movable region, in a manner to cover at least the first electrode film and the second electrode film.

(5) In the piezoelectric resonator in accordance with an aspect of the invention, the piezoelectric vibrating element has a predetermined first resonance frequency, and may have a second resonance frequency lower by a predetermined frequency than the first resonance frequency as a result of forming the fluorocarbon resin film having a predetermined film thickness in a predetermined region of the piezoelectric vibrating element.

(6) In the piezoelectric resonator in accordance with an aspect of the invention, the fluorocarbon resin film may be formed from the fluorocarbon resin material having water repellent property and oil repellent property.

(7) In the piezoelectric resonator in accordance with an aspect of the invention, the fluorocarbon resin film may be formed from a fluoropolyether base material.

(8) A piezoelectric oscillator in accordance with an aspect of the invention includes any one of the above-described piezoelectric resonators and an oscillation circuit electrically connected thereto.

According to the invention, a piezoelectric oscillator with a piezoelectric resonator having a long-term high reliability can be provided.

(9) An electronic apparatus in accordance with an aspect of the invention includes any one of the piezoelectric resonators described above.

According to the invention, an electronic apparatus with a piezoelectric resonator having a long-term high reliability can be provided.

(10) A method for manufacturing a piezoelectric resonator in accordance with the invention pertains to a method for manufacturing a piezoelectric resonator including a package having a cavity; electrode pads formed within the cavity; a bonding section formed on the electrode pads, and a piezoelectric vibrating element having one end supported by the bonding section, wherein the piezoelectric vibrating element includes a piezoelectric substrate, and an electrode film formed on the piezoelectric substrate and electrically connected to the bonding section, the method including the steps of forming a fluorocarbon resin film on a movable region where an area of the piezoelectric vibrating element supported by the bonding section is defined as a supported region and an area of the piezoelectric vibrating element that is not supported by the bonding section is defined as the movable region; and mounting, after forming the fluorocarbon resin film, the supported region of the piezoelectric vibrating element to the bonding section.

According to the invention, a method for manufacturing a piezoelectric resonator having a long term high reliability can be provided.

(11) In the method for manufacturing a piezoelectric resonator in accordance with an aspect of the invention, adjustment of a resonance frequency of the piezoelectric resonator may be conducted in the step of forming the fluorocarbon resin film.

(12) In the method for manufacturing a piezoelectric resonator in accordance with an aspect of the invention, the step of forming a metal film on the piezoelectric substrate may be further included, and the adjustment of a resonance frequency of the piezoelectric resonator may be conducted in the step of forming the metal film.

BRIEF DESCRIPTION OF THE DRAWINGS

FIGS. 5A-5C are plan views schematically showing the method for manufacturing a piezoelectric resonator in accordance with the present embodiment.

FIGS. 6A-6E show diagrams for explaining the effect of a fluorocarbon resin film to prevent adhesion of dimethylpolysiloxanes.

DESCRIPTION OF EXEMPLARY EMBODIMENTS

Examples of preferred embodiments of the invention are described below with reference to the accompanying drawings. It is noted that the invention is not limited only to the embodiments described below. The invention includes modifications of the following embodiments and combinations of the foregoing embodiments and the modifications freely combined together.

1. Piezoelectric Resonator and Piezoelectric Oscillator

A piezoelectric resonator in accordance with an embodiment of the invention will be described below with reference to the accompanying drawings.

Figure 1A:
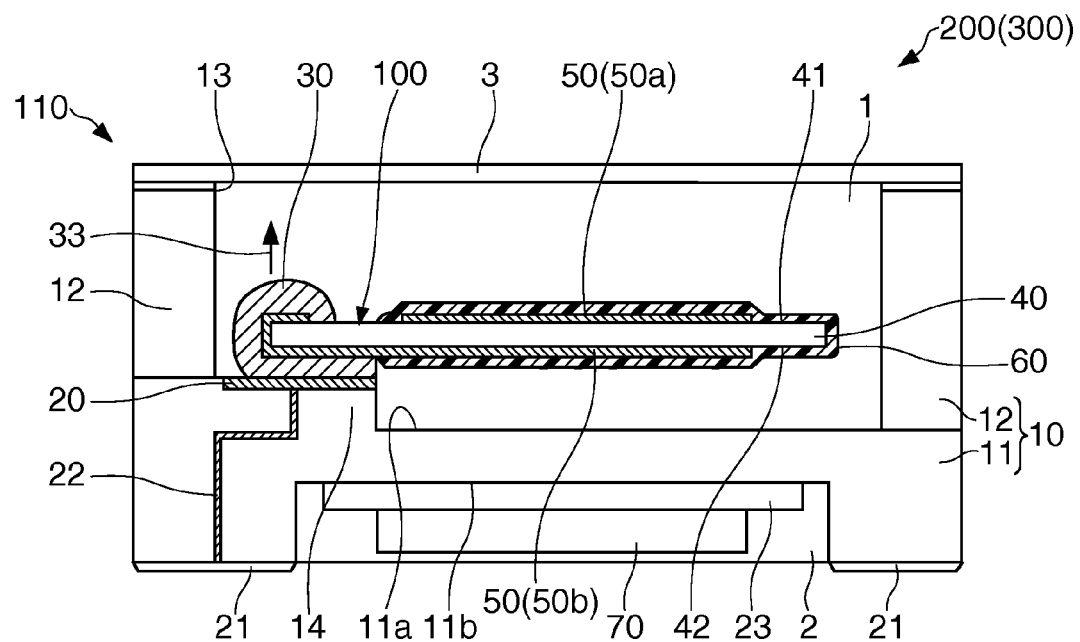
FIGS. 1A and 1B are cross-sectional view and plan view schematically showing a main portion of a piezoelectric resonator in accordance with an embodiment of the invention.
Figure 1B:
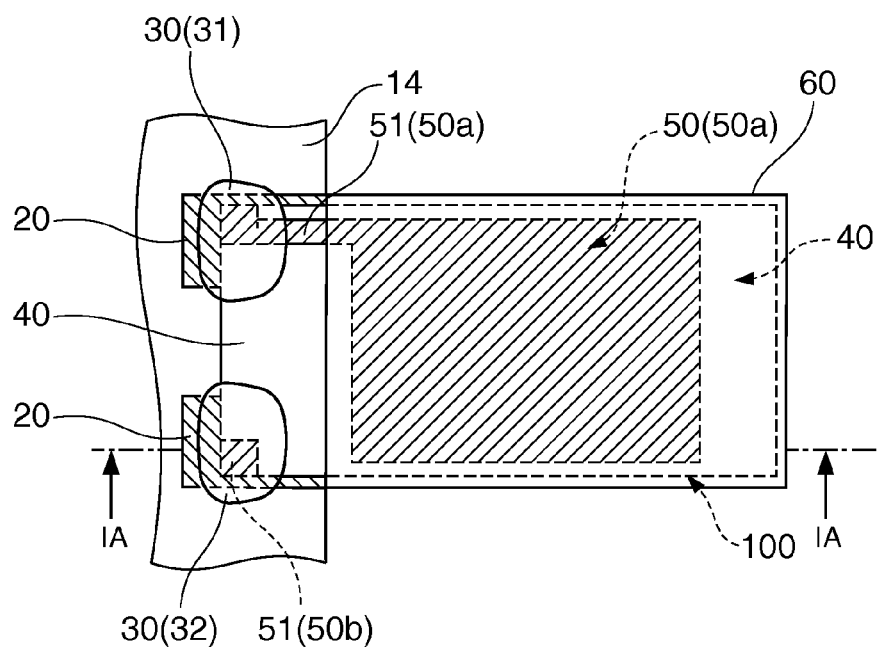

FIG. 1A is a cross-sectional view of a piezoelectric resonator 200 in accordance with the present embodiment. FIG. 1B is a plan view of a main portion of the piezoelectric resonator 200 in accordance with the present embodiment.

As shown in FIG. 1A, the piezoelectric resonator 200 in accordance with the present embodiment includes a package 110 having a cavity 1, electrode pads 20 formed within the cavity 1, bonding sections 30 formed on the electrode pads 20, and a piezoelectric vibrating element 100 having one end supported by the bonding sections 30.

As shown in FIG. 1A, the package 110 has the cavity 1. The package 110 may have the cavity 1 that is defined by, for example, a package body 10 formed from a base substrate 11 and a wall section 12, and a sealing member 3 that is formed on the wall section 12 and closes an opening section.

The package body 10 may be formed from the base substrate 11 and the wall section 12, as shown in FIG. 1A. However, the shape and structure of the package body 10 is not particularly limited as long as they are in a container-like configuration that is capable of storing the piezoelectric vibrating element 100.

The base substrate 11 may be in a plate-like member. The base substrate 11 may have a first face 11a and a second face 11b, as shown in FIG. 1A. The piezoelectric vibrating element 100 can be mounted on the first face 11a of the base substrate 11. As shown in FIG. 1A, the first face 11a may have a base section 14 that is defined by a surface protruding from the first face 11a. Also, the first face 11a may be in a flat surface (not shown). In this case, the base section 14 may be located in a predetermined region within the first face 11a (not shown). Also, the second face 11b of the base substrate 11 may have a recessed section 2 for mounting an IC part 70 to be described below.

The wall section 12 may be formed on the first face 11a of the base substrate 11. The shape of the wall section 12 is not particularly limited as long as it can surround a region of the base substrate 11 where the piezoelectric vibrating element 100 is mounted. The wall section 12 defines an opening section 13 for storing the piezoelectric vibrating element 100.

The base substrate 11 and the wall section 12 may be formed in one piece with the same material. The base substrate 11 and the wall section 12 may be formed with mutually different materials, and may be bonded together with an adhesive or the like. The material of the package body 10 is not particularly limited. The material of the base substrate 11 may be selected from, for example, single crystalline silicon, glass, ceramics and the like. The material of the wall section 12 may be selected from, for example, metal such as iron-nickel, stainless metal, stainless steel and the like, single crystalline silicon, glass, ceramics and the like.

The sealing member 3 is formed on the package body 10 in a manner to close the opening section 13. The opening section 13 may be sealed by the sealing member 3 by using soldering material such as soft solder and hard solder, or seam sealing. The shape of the sealing member 3 is not particularly limited as long as it can close the opening section 13. For example, as shown in FIG. 1A, the sealing member 3 may be of a plate-like member. For example, the sealing member 3 may be made of a material selected from, for example, metal such as iron-nickel, stainless metal, stainless steel and the like, single crystalline silicon, glass, ceramics and the like.

The package 110 can have the cavity 1 defined by any one of the compositions described above. The interior of the cavity 1 may have a vacuum. The interior of the cavity 1 may be in a reduced pressure state compared to atmospheric pressure. Also, the interior of the cavity 1 may contain an inert gas atmosphere such as nitrogen gas.

As shown in FIG. 1A, electrode pads 20 are formed within the cavity 1. The region where the electrode pad 20 is formed is not particularly limited if the pad is within the cavity 1. For example, as shown in FIG. 1A, the electrode pad 20 may be formed on the base portion 14 of the first face 11a of the package body 10. Also, as shown in FIG. 1B, a plurality of electrode pads 20 may be formed. At least one of the electrode pads 20 may be electrically connected, for example, to a mounting terminal 21 formed on the second face 11b of the package body 10 through an internal wiring 22 formed within the package body 10, as shown in FIG. 1A. Mounting terminals 21 may be formed in plurality. At least one of the mounting terminals 21 may be a terminal for grounding. Also, at least one of the mounting terminals 21 may be a terminal for power supply. Also, at least one of the electrode pads 20 may be electrically connected to an electrode pad 23 formed in the recessed section 2 of the second face 11b through an unshown internal wiring. The shape of the electrode pad 20 is not particularly limited. The shape of the electrode pad 20 may be, for example, circular, or a rectangular, as seen in a plan view. The structures and materials for the electrode pads 20, the mounting terminals 21 and the electrode pad 23 are not particularly limited. For example, the electrode pads 20, the mounting terminals 21, and the electrode pad 23 may be formed with a single layer conductive film. Alternatively, the electrode pads 20 may be formed with a laminate of a plurality of conductive films. The electrode pads 20, the mounting terminals 21, the electrode pad 23 and the internal wiring 22 may be each composed of a metal layer including, for example, platinum (Pt), iridium (Ir), gold (Au), nickel (Ni), chromium (Cr), tin (Sn) or the like.

The bonding section 30 is a bonding section comprised of silicone base conductive adhesive, having adhesiveness when uncured, but can support the piezoelectric vibrating element 100 after cured. More concretely, the bonding section 30 may be a conductive adhesive made of silicone resin and conductive fillers mixed therein. The conductive fillers to be mixed are not particularly limited as long as they are electrically conductive, and may be composed of silver (Ag), for example. As shown in FIG. 1B, the bonding section 30 may be formed on each of the plurality of the electrode pads 20. As shown in FIG. 1B, the bonding section 30 formed on one of the electrode pads 20 may be defined as a first bonding section 31. Also, the bonding section 30 formed on the other of the electrode pads 20 may be defined as a second bonding section 32. According to this structure, the electrode pads 20 and the piezoelectric vibrating element 100 can be electrically connected. As shown in FIG. 1A, the bonding section 30 composed of silicone base conductive adhesive includes silicone resin, and generates silicone vapor 33 composed of dimethylpolysiloxanes even in room temperature.

The piezoelectric vibrating element 100, as shown in FIG. 1A, is supported by the bonding sections 30 within the cavity 1. As shown in FIG. 1A and FIG. 1B, one end of the piezoelectric vibrating element 100 is supported in a cantilever manner by the bonding sections 30 (i.e., the first bonding section 31 and the second bonding section 32). By this, the piezoelectric vibrating element 100 can vibrate while being supported. For example, as shown in FIG. 1B, when the piezoelectric vibrating element 100 is rectangular and has two corner sections interposing one side, the plural bonding sections 30 (i.e., the first bonding section 31 and the second bonding section 32) formed on the plural electrode pads 20 may support these two corner sections, respectively. In other words, the piezoelectric vibrating element 100 is supported by the bonding sections 30 (the first bonding section 31 and the second bonding section 32) at the two corner sections interposing one side of the rectangle shape of the piezoelectric vibrating element 100.

Here, as shown in FIG. 1B, regions of the piezoelectric vibrating element 100 supported by the bonding section 30 are defined as supported regions 43. In other words, regions of the piezoelectric vibrating element 100 that come in contact with the bonding section 30 (the first bonding section 31 and the second bonding section 32) are the supported regions 43. Placements of the supported regions 43 are not particularly limited as long as the piezoelectric vibrating element 100 is supported, and may be appropriately adjusted so that the piezoelectric vibrating element 100 has a desired resonance frequency when the piezoelectric vibrating element 100 is supported. Also, as shown in FIG. 1B, in the piezoelectric substrate 40 of the piezoelectric vibrating element 100, a region other than the supported region 43 is defined as a movable region 44. In other words, the region in the piezoelectric vibrating element 100 which does not come in contact with the bonding section is the movable region 44.

It is noted that the regions described above may be a region on the piezoelectric substrate 40 to be described below. For example, the supported region 43 may be a region where the bonding section 30 is directly or indirectly formed on the piezoelectric substrate 40. The movable region 44 may be a region where the bonding section 30 is not directly or indirectly formed on the piezoelectric substrate 40.

As shown in FIG. 1A and FIG. 1B, the piezoelectric resonator 200 in accordance with the present embodiment has the piezoelectric vibrating element 100, and a fluorocarbon resin film 60 formed on the movable region 44 of the piezoelectric vibrating element 100.

Figure 2A:
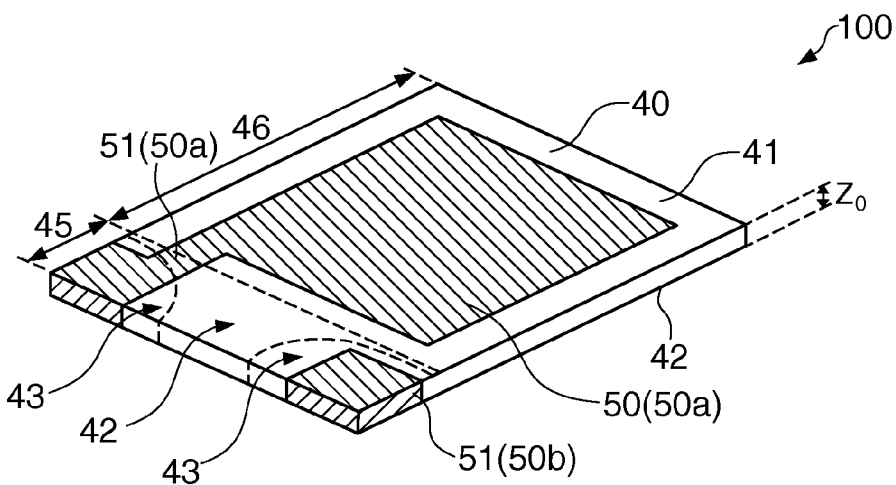
FIGS. 2A and 2B are perspective views schematically showing a main portion of the piezoelectric resonator in accordance with the present embodiment.
Figure 2B:
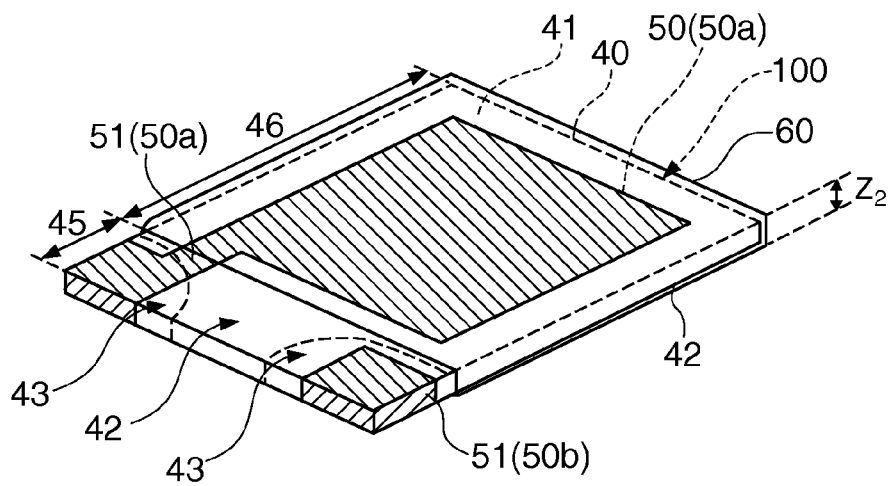
Figure 3A:
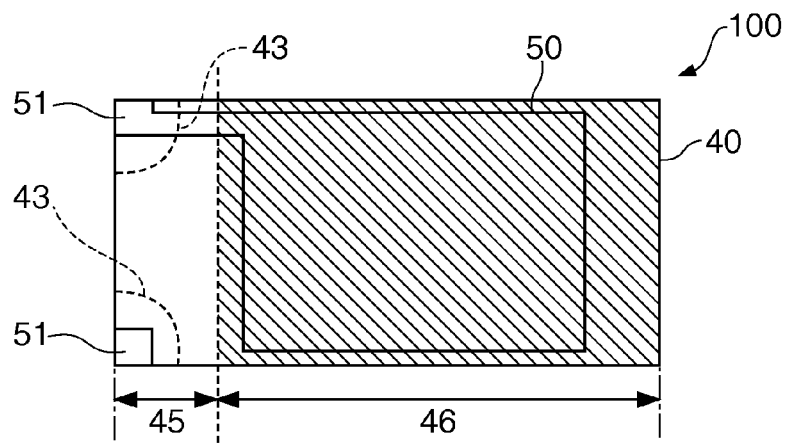
FIGS. 3A-3C are plan views schematically showing a main portion of the piezoelectric resonator in accordance with the present embodiment.
Figure 3B:
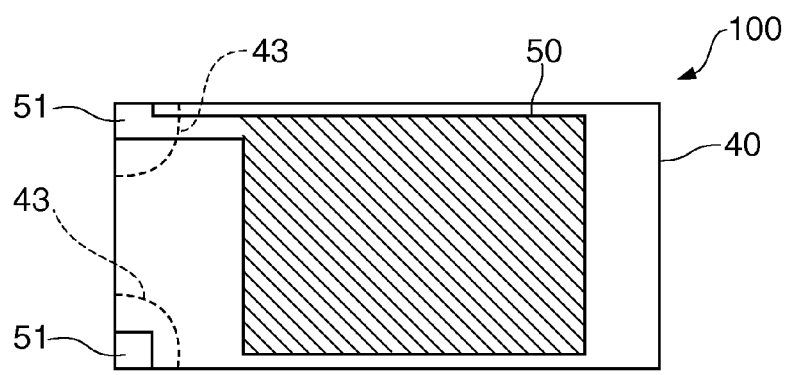
Figure 3C:
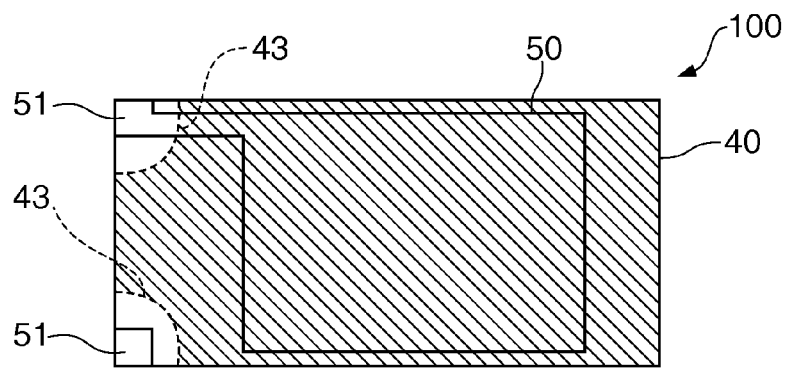

Referring to the drawings, the piezoelectric vibrating element 100 and the fluorocarbon resin film 60 will be described in detail. FIG. 2A is a perspective view schematically showing the piezoelectric vibrating element 100. FIG. 2B is a perspective view schematically showing the piezoelectric vibrating element 100 where the fluorocarbon resin film 60 is formed. FIGS. 3A through 3C are plan views of the piezoelectric vibrating element 100 for schematically describing the forming region of the fluorocarbon resin film 60.

As shown in FIG. 2A, the piezoelectric vibrating element 100 has mutually opposing first and second faces 41 and 42, and includes a piezoelectric substrate 40 having thickness shear vibration as its main vibration, electrode films 50 formed on the first face 41 and the second face 42, respectively, and a lead electrode 51 that electrically connects the electrode films 50 and the bonding section 30.

As shown in FIG. 2A, the piezoelectric substrate 40 is made of a plate-like member and has the mutually opposing first face 41 and second face 42. The first face 41 and the second face 42 may be two main surfaces of the piezoelectric substrate 40. The shape of the piezoelectric substrate 40 is not particularly limited. The shape of the piezoelectric substrate 40 may be, for example, rectangular, as viewed in a plan view. Here, as shown in FIG. 2A, a plane on which the first face 41 and the second face 42 are developed is defined as an XY plane, and a normal direction to the YX plane is defined as a Z-axis direction. The piezoelectric substrate 40 may be a piezoelectric body that has thickness shear vibration as its main vibration. In other words, the piezoelectric substrate 40 may be a piezoelectric body that generates thickness shear vibration as its main vibration, when a voltage signal is applied in the thickness direction (the Z-axis direction in FIG. 2A). Therefore, the piezoelectric substrate 40 may generate flexural vibration or other vibration modes when a voltage signal is applied in its thickness direction. The piezoelectric substrate 40 may be formed from a piezoelectric material, such as, for example, quartz, lithium tantalate, lithium niobate or the like. When the piezoelectric substrate 40 is formed from a quartz substrate, it can be formed so that a normal direction to the quartz substrate coincides with the Z-axis of the crystal of the quartz. In other words, the normal direction to the quartz substrate may include components of the X-axis or the Y-axis of the crystal axes of the quartz. Also, the quartz substrate may be an AT cut quartz substrate, or a BT cut quartz substrate. For example, when the piezoelectric substrate 40 is formed from an AT cut or BT cut quartz substrate, thickness shear vibration can be more readily generated by application of a voltage signal in the thickness direction, and deviations in thickness of quartz substrates due to temperature changes at the time of manufacturing can be suppressed. Also, as shown in FIG. 2A, the piezoelectric substrate 40 has a predetermined thickness Zo. By this, the piezoelectric substrate 40 can have a predetermined resonance frequency.

Here, as shown in FIG. 2A, the supported region 43 is defined at one end of the piezoelectric substrate 40. As shown in FIG. 2A, when the piezoelectric vibrating element 100 is rectangular and has two corner sections interposing one side, the supported region 43 may be provided at each of the two corner sections of the piezoelectric vibrating element 100. As shown in FIG. 2A, a region on one of the short sides of the piezoelectric vibrating element 100 including a portion of the supported regions 43 may be defined as a non-vibration region 45, and the other region composed only of the movable region 44 may be defined as a vibration region 46. It is noted that the non-vibration region 45 and the vibration region 46 are regions defined for designing, and are not particularly limited. For example, when the piezoelectric vibrating element 100 is supported by the bonding section 30, a region that does not substantially vibrate may be defined as the non-vibration region 45, and a region of the piezoelectric vibrating element 100 that substantially vibrates by thickness shear vibration may be defined as the vibration region 46.

The metal films 50 are formed on the first face 41 and the second face 42 of the piezoelectric substrate 40, respectively, as shown in FIG. 2A. The metal film 50 on the first face 41 and the metal film 50 on the second face 42 may be formed in a manner to overlap each other at predetermined regions of the first face 41 and the second face 42, and can interpose the piezoelectric substrate 40 in the Z-axis direction (see FIG. 1A). As shown in FIG. 2A, the metal films 50 are formed within the vibration region 46. The forming region of the metal films 50 is not particularly limited if it is within the vibration region 46, and the metal films may be formed in a manner to cover central portions of the main surfaces (the first face 41 and the second face 42) of the piezoelectric substrate 40. Also, as shown in FIG. 2A, they may be formed other than the peripheral sections of the main surfaces (the first face 41 and the second face 42), as shown in FIG. 2A. Also, the metal films may be formed in a manner to cover the entire surface including the peripheral portions of the first face 41 and the second face 42 in the vibration region 46, though the figure does not show. By this, the metal films 50 can form excitation electrodes in the piezoelectric vibrating element 100.

The material and the structure of the metal films 50 are not particularly limited as long as they have conductivity. For example, the metal film 50 may be formed in a single layer. The metal film 50 may be a metal layer including, for example, platinum (Pt), iridium (Ir), gold (Au), aluminum (Al) or the like. Alternatively, the metal film 50 may be formed in a laminate of a plurality of films. When the metal film 50 is formed in a laminate, the metal film 50 may have a laminate structure including a first metal layer composed of a metal of high coherency with the piezoelectric substrate 40, such as, nickel (Ni), chrome (Cr) or the like and a second metal layer composed of gold (Au), from the side of the piezoelectric substrate 40 in this order. By this, coherency between the piezoelectric substrate 40 and the metal films 50 can be increased, and the reliability of the piezoelectric vibrating element 100 can be improved.

The film thickness of the metal film 50 is appropriately adjusted in consideration of the resonance frequency of the piezoelectric vibrating element 100. Its details will be described later. By this, the piezoelectric vibrating element 100 has a predetermined thickness $Z_1$ defined by the piezoelectric substrate 40 and the metal films 50. By this, the piezoelectric vibrating element 100 can have a first resonance frequency that is a predetermined resonance frequency. Here, the first resonance frequency may be set to be higher by a predetermined frequency than a second resonance frequency to be described below.

As shown in FIG. 2A, the lead electrode 51 is formed as a lead wire of the metal film 50. The placement of the lead electrode 51 is particularly limited as long as it extends from the metal film 50 formed within the vibration region 46, and reaches the supported region 43. By this, the conductive bonding section 30 formed at the supported region 43 and the metal film 50 can be electrically connected. As shown in FIG. 2A, the lead electrode 51 may be formed in a manner, for example, to extend from the first face 41 to the second face 42 or from the second face 42 to the first face 41 in the supported region 43. In other words, as shown in FIG. 2A, the lead electrode 51 may be formed in a manner to cover the corner section on the short side of the piezoelectric substrate 40 that defines the supported section 42. This can improve the electrical connectivity with the bonding section 30. The lead electrode 51 may be formed in a single layer. The lead electrode 51 may be a metal layer including, for example, platinum (Pt), iridium (Ir), gold (Au), nickel-chrome alloy (Ni—Cr), aluminum (Al) or the like. Alternatively, the lead electrode 51 may be formed in a laminate of a plurality of films. When the lead electrode 51 is formed in a laminate, the lead electrode 51 may have a laminate structure including a first metal layer composed of a metal of high coherency with the piezoelectric substrate 40, such as, nickel (Ni), chrome (Cr) or the like and a second metal layer composed of gold (Au), from the side of the piezoelectric substrate 40 in this order. Also, the lead electrode 51 may be formed in one piece with the metal film 50 by vapor deposition, sputtering or the like, and may have the same material and structure. Also, a metal layer having high coherency with the bonding section 30 may appropriately be formed at the topmost surface layer of the lead electrode 51, although not illustrated.

Here, as shown in FIG. 1A and FIG. 1B, the metal film 50 formed on the first face 41 of the piezoelectric substrate 40 and the lead electrode 51 of the metal film 50 may be defined as a first electrode film 50a. Also, the metal film 50 formed on the second face 42 of the piezoelectric substrate 40 and the lead electrode 51 of the metal film 50 may be defined as a second electrode film 50b. As shown in FIG. 1B, the first electrode film 50a may be electrically connected to the first bonding section 31. Also, although not shown, the second electrode film 50b may be electrically connected to the second bonding section 32.

Any one of the structures described above may be used for the composition of the piezoelectric vibrating element 100.

As shown in FIG. 2B, the piezoelectric resonator 200 in accordance with the present embodiment has the fluorocarbon resin film 60 in the movable region of the piezoelectric vibrating element 100. The fluorocarbon resin film 60 is not particularly limited to any material as long as it is a fluorocarbon resin having water repellent and oil repellent property. As the material for the fluorocarbon polymer film 60, fluoropolyether base fluorocarbon resin, fluoropolyethylene base fluorocarbon resin, and the like can be used.

The region of the fluorocarbon resin film 60 to be formed is not particularly limited as long as it is within the movable region 44. Preferably, the fluorocarbon resin film 60 may be formed in a manner to cover the vibration region 46 that is a region of the piezoelectric vibrating element 100 that substantially vibrates within the movable region 44. FIGS. 3A through 3C schematically show forming regions of the fluorocarbon resin film 60. In FIGS. 3A through 3C, the forming region of the fluorocarbon resin film 60 is indicated by a hatched portion. As shown in FIG. 3A, the fluorocarbon resin film 60 may be formed in a manner to cover the entire surface of the vibration region 46. In other words, the fluorocarbon resin film 60 may cover the first face 41 and the second face 42 that are the main surfaces and side surfaces of the piezoelectric substrate 40, in the vibration region 46. By this, the fluorocarbon resin film 60 can entirely cover the portion of the piezoelectric vibrating element 100 that substantially vibrates. Also, as shown in FIG. 3B, the fluorocarbon resin film 60 may be formed in a manner to cover the metal films 50, within the vibration region 46. Also, as shown in FIG. 3C, the fluorocarbon resin film 60 may be formed in a manner to cover the entire surface of the movable region 44 including the vibration region 46.

The film thickness of the fluorocarbon resin film 60 is appropriately adjusted in consideration of the resonance frequency of the piezoelectric vibrating element 100. Its details will be described later. By this, as shown in FIG. 2B, the piezoelectric vibrating element 100 has a predetermined thickness $Z_2$ defined by the piezoelectric substrate 40, the metal films 50 and the fluorocarbon resin film 60. By this, the piezoelectric vibrating element 100 can have a second resonance frequency that is a predetermined frequency.

Any one of the structures described above may be used for the composition of the piezoelectric vibrating element 200 in accordance with the present embodiment.

It is noted that the configuration of the piezoelectric vibrating element 100 to be mounted on the piezoelectric resonator 200 in accordance with the present embodiment is not limited to the composition described above. For example, it may be configured into a known tuning fork type piezoelectric vibrating element or a known SAW piezoelectric vibrating element. Even in the case of a tuning fork type piezoelectric vibrating element or a SAW piezoelectric vibrating element, the region that substantially vibrates can be covered by the fluorocarbon resin film 60.

Also, as shown in FIG. 1A, the piezoelectric resonator 200 may have an IC component 70. The IC component 70 may be, for example, an oscillation circuit component. The location where the IC component is mounted is not particularly limited. For example, the IC part 70 may be mounted in a recessed section 2 of the package body 10, as shown in FIG. 1A. Here, the IC component 70 may be electrically connected to the electrode pad 23 formed within the recessed section 2. In other words, it can be electrically connected to the piezoelectric vibrating element 100 through an unshown internal wiring and the conductive bonding section 30. Also, although not shown, the IC component 70 may be mounted within the cavity 1. In this case, the IC component 70 may be electrically connected to the piezoelectric vibrating element 100 through wire bonding or the like.

The structure described above may be used for the composition of the piezoelectric oscillator 300 in accordance with the present embodiment.

The piezoelectric vibrating element 200 and the piezoelectric oscillator 300 in accordance with the present embodiments have the following characteristics, for example.

According to the piezoelectric vibrating element 200 and the piezoelectric oscillator 300 in accordance with the present embodiments, it is possible to provide a piezoelectric resonator and a piezoelectric oscillator in which the vibration region 46 that is a region of the piezoelectric vibrating element 100 that substantially vibrates is covered by the fluorocarbon resin film 60. By this, dimethylsiloxanes components of silicone vapor generated from the silicone resin composing the bonding section 30 can be prevented from adhering to the surface of the piezoelectric vibrating element 100. In other words, it is possible to suppress the phenomenon in which the frequency of resonance frequency lowers due to an increase in the mass of the piezoelectric vibrating element 100 after having been manufactured and used for a long time. Accordingly, it is possible to provide piezoelectric resonators and piezoelectric oscillators having high reliability for a long time. It is noted that the adhesion preventing effect against dimethylsiloxanes components of the fluorocarbon resin film 60 will be described in greater detail below.

The piezoelectric resonator 200 and the piezoelectric oscillator 300 in accordance with the present embodiments are very useful in, for example, high-frequency piezoelectric resonators. Details thereof will be described below.

For example, in the case of a piezoelectric resonator using an AT cut quartz, when the added mass $\Delta m$ is small compared to the vibrating mass, it is known that the amount of frequency change $\Delta f$ can be defined by Sauerbrey equation. More specifically, $\Delta f$ is in proportion to $\Delta m$, and in proportion to the square of the frequency f. For example, when dimethylsiloxanes adheres as a micro amount deposit to an AT quartz resonator with f=26 MHz in the thickness of 1 nm, and the density of dimethylsiloxanes is 0.95 [g/cm$^3$], $\Delta f$ is about −146 Hz. When $\Delta f/f$ is ±10 ppm as a specified range in the product specification, $\Delta f/f$ becomes to be −5.6 ppm, which is within the specified range.

However, the higher the frequency of a piezoelectric resonator device, the more the impact of a micro amount deposit becomes serious. In the case of a quartz resonator with f=200 MHz, the deposition of the same amount described above would result in $\Delta f$=−8.6 MHz, and $\Delta f/f$=−43 ppm which exceeds the specified value and therefore results in a defective product. In other words, in the case of a high frequency piezoelectric resonator with f being about 200 MHz, deposition of dimethylsiloxanes in the thickness of 1 nm would cause the resonance frequency of the piezoelectric resonator to be outside the specified range.

According to the piezoelectric resonator in accordance with the present embodiment, dimethylsiloxanes components can be prevented from adhering to the piezoelectric vibrating element for an extended period of time. Therefore, according to the piezoelectric resonator in accordance with the present embodiment, even in the case of the aforementioned high-frequency rated piezoelectric vibrating element, the reliability in the resonance frequency of the piezoelectric resonator can be secured. As a result, piezoelectric resonators and piezoelectric oscillators having a long-term high reliability can be provided.

Also, the piezoelectric vibrating element 100 is covered by the fluorocarbon resin film 60 having water repellent and oil repellent properties. Therefore, even when moisture or oil remains in the cavity 1 after manufacturing, or moisture in the air atmosphere or oil enters the cavity 1 when an unexpected damage occurs to the sealing member 3 or the like after manufacturing, adhesion of moisture to the piezoelectric vibrating element 100 can be prevented. Therefore, according to the piezoelectric resonator in accordance with the present embodiment, defective vibration of the piezoelectric vibrating element 100 due to moisture adhesion can be prevented, and the reliability of the piezoelectric resonator 200 and the piezoelectric oscillator 300 can be enhanced.

In view of the above, according to the piezoelectric resonator in accordance with the present embodiment, the piezoelectric resonator 200 and the piezoelectric oscillator 300 having a long-term high reliability can be provided.

Method for Manufacturing Piezoelectric Resonator and Piezoelectric Oscillator

A method for manufacturing a piezoelectric resonator in accordance with an embodiment of the invention will be described below with reference to the accompanying drawings.

Figure 4A:
FIGS. 4A-4C are cross-sectional views schematically showing a method for manufacturing a piezoelectric resonator in accordance with an embodiment of the invention.
Figure 4B:
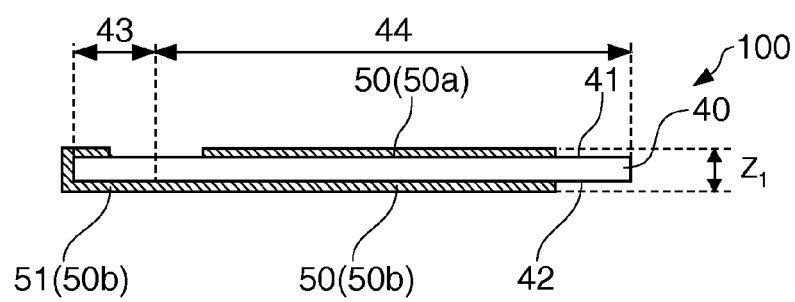
Figure 4C:
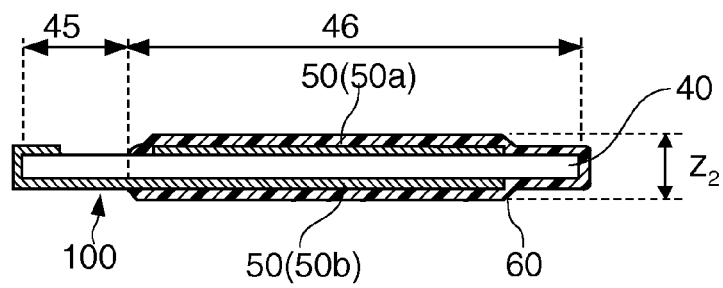

FIGS. 4A-4C are cross-sectional views schematically showing a method for manufacturing a piezoelectric resonator 200 in accordance with the present embodiment. FIGS. 5A-5C are plan views schematically showing the method for manufacturing a piezoelectric resonator 200 in accordance with the present embodiment.

The method for manufacturing a piezoelectric resonator in accordance with the present embodiment includes, as shown in FIGS. 4 and 5, the steps of preparing a package body 10 having an opening section 13, preparing a piezoelectric vibrating element 100, mounting the piezoelectric vibrating element 100 on the package body 10 through the opening section 13, and closing the opening section 13 thereby forming a cavity 1. The step of preparing the piezoelectric vibrating element 100 includes the steps of preparing a piezoelectric substrate 40, forming a metal film 50 on the piezoelectric substrate 40 thereby forming the piezoelectric vibrating element 100, and forming a fluorocarbon resin film 60 in a predetermined region of the piezoelectric vibrating element 100.

First, as shown in FIG. 4A, a piezoelectric substrate 40 having a predetermined thickness Zo is prepared. The material for the piezoelectric substrate 40 is not particularly limited to any material as long as it is a thickness shear mode piezoelectric material whose frequency is determined by thickness difference, and may use, for example, a quartz substrate. For the piezoelectric substrate 40, for example, a quartz wafer having a plurality of segmented regions may be prepared, and the quartz wafer is etched by photolithography technique or the like whereby its film thickness can be adjusted to a desired thickness Zo (not shown). The quartz wafer with its thickness being adjusted may be divided along border lines of the segmented regions by, for example, dicing, etching or the like, whereby a piezoelectric substrate 40 shown in FIG. 4A can be obtained. It is noted that the processing order for performing the division step is not particularly limited, and may be performed after the step of forming a metal film 50, the step of forming a fluorocarbon resin film 60 or the step of adjusting frequency, which will be described below.

Next, as shown in FIG. 4B, a first electrode film 50a and a second electrode film 50b (metal films, lead electrodes 51) are formed on main surfaces, i.e., a first face 41 and a second face 42 of the piezoelectric substrate 40, respectively. This step can be conducted by using a known film forming technique, for example, by vapor deposition, sputtering or the like. For example, chrome, gold and the like may be deposited in layers by a sputtering method or the like to form a conductive layer (not shown), and the conductive layer may be etched into a predetermined shape, whereby the first electrode film 50a and the second electrode film 50b may be formed. Details of the first electrode film 50a and the second electrode film 50b have been described above, and therefore are not described here. By forming the first electrode film 50a and the second electrode film 50b, the piezoelectric vibrating element 100 can be formed. It is noted here that, by adjusting the film thickness of the metal film 50 to a desired film thickness, the thickness of the piezoelectric vibrating element 100 can be adjusted to a desired thickness $Z_1$. In other words, by adjusting the film thickness of the metal film 50, the resonance frequency of the piezoelectric vibrating element can be adjusted. By this, the piezoelectric vibrating element 100 may have a first resonance frequency. It is noted here that the first resonance frequency can be set to be higher by a predetermined frequency than a second resonance frequency to be described below.

Next, as shown in FIG. 4C, a fluorocarbon resin film 60 is formed in a predetermined region within the movable region 44. This step can be conducted by using a known film forming technique, for example, vapor deposition, sputtering or the like. When forming by a liquid phase method, the fluorocarbon resin film 60 may be formed through coating a fluorocarbon resin film on the entire surface of the piezoelectric vibrating element 100 in a desired film thickness, and then patterning the film by using plasma etching or the like. When forming by a gas phase method, a mask processing is applied to a predetermined region, and the fluorocarbon resin film 60 having a desired film thickness may be formed. It is noted that details of the fluorocarbon resin film 60 have been described above, and therefore are not provided here. By adjusting the film thickness of the fluorocarbon resin film 60 to a desired film thickness, the thickness of the piezoelectric vibrating element 100 and the fluorocarbon resin film 60 combined can be adjusted to a desired thickness $Z_2$. In other words, by adjusting the film thickness of the fluorocarbon resin film 60, the resonance frequency of the piezoelectric vibrating element 100 can be adjusted. By this, the piezoelectric vibrating element 100 with the fluorocarbon resin film 60 formed thereon may have a second resonance frequency. Here, if the cavity 1 is vacuum sealed, the second frequency may be adjusted and set higher by a predetermined frequency than a final resonance frequency after the piezoelectric vibrating element 100 is sealed in the cavity 1. In other words, the second resonance frequency is a frequency in the air atmosphere. Therefore, in consideration of a frequency reduction in vacuum, the resonance frequency may be adjusted higher by a predetermined frequency, thereby setting the same as the second resonance frequency. Also, it is noted here that the second resonance frequency may be adjusted and set to a final resonance frequency after the piezoelectric vibrating element 100 is sealed in the cavity 1. It is noted that the final resonance frequency is a target resonance frequency that the piezoelectric resonator 200 in accordance with the present embodiment would have as a standard value after the manufacturing process.

Next, as shown in FIG. 5A, a package body 10 having an opening section 13 is prepared. The package body 10 is not particularly limited to any material, and may be made of single crystalline silicon, nickel, stainless metal, stainless steel, ceramics, or glass ceramics. Therefore, the step of preparing the package body 10 may differ depending on the material to be used. Accordingly, the step of preparing the package body 10 having the opening section 13 is not particularly limited. For example, when using single crystalline silicon, a base substrate 11 and a wall section 12 composing the package body 10 may be formed in one piece by photolithography technique or the like. When using ceramics, the package body 10 may be formed through forming green sheets, then laminating the green sheets, and conducting sintering, bonding and the like. It is noted that a base portion 14 may be formed at the base substrate 11 of the package body 10 as shown in FIG. 5A. Further, although not shown, a recessed portion may be formed in a second face 11a of the base substrate 11. Here, the region forming the interior of the cavity 1 that is surrounded by the base substrate 11 and the wall section 12 and formed on closing the opening section by a sealing member 3 is defined as a region 1a.

As shown in FIG. 5A, electrode pads 20 are formed in the region 1a. The electrode pads 20 are formed by a known film forming technique. The electrode pads 20 may be formed by, for example, an electrolytic plating method or the like. The electrode pads 20 may be formed on, for example, the base substrate 14. Details of the electrode pads 20 have been described above, and therefore the same is omitted here. Also, at this time, mounting terminals 21 and electrode pads 23 may be formed on the package body 10. Although not shown, the base substrate 14 may be provided with a through hole that communicates with the electrode pads 20, and internal wirings may be formed within the through hole, whereby the electrode pads 20 may be electrically connected to the mounting terminals 21 and the electrode pads 23.

Next, as shown in FIG. 5B, bonding sections 30 are formed on the electrode pads 20. The bonding sections 30 may be formed through supplying onto the electrode pads 20 silicone base conductive adhesive in an amount necessary for supporting the piezoelectric vibrating element 100. It is noted that details of the bonding sections 30 have been described above, and are therefore omitted here.

Next, as shown in FIG. 5C, the piezoelectric vibrating element 100 having the fluorocarbon resin film 60 formed thereon is mounted in the cavity 1 of the package body 10. At this time, the piezoelectric vibrating element 100 is supported by the bonding sections 30. After mounting the piezoelectric vibrating element 100, silicone base conductive adhesive may be further supplied to the bonding sections 30 for more firmly fixing the piezoelectric vibrating element 100.

Next, although not shown, the opening section 13 is closed by a sealing member 3, thereby forming the cavity 1. For example, the sealing member 3 may be bonded to the wall section 12 with a known adhesive, thereby closing the opening section 13. When sealing the region 1a with the sealing member, the region 1a may be filled with an inert gas such as nitrogen gas or the like in advance, and then may be air-tightly sealed by the sealing member 3. Also, a vacuum may be drawn to the region 1a, and the region 1a may be vacuum sealed.

In the method for manufacturing a piezoelectric resonator in accordance with the present embodiment, the step of adjusting the resonance frequency of the piezoelectric resonator may be conducted in the step of forming the metal film 50 or in the step of forming the fluorocarbon resin film 60. Details thereof will be described below.

In piezoelectric vibrating elements having thickness shear vibration as their main vibration, differences in thickness in the vibration regions of the piezoelectric elements affect the frequencies thereof. Accordingly, in order for the piezoelectric vibrating element 100 to have a desired final resonance frequency, a resonance frequency adjusting step may be conducted in the manufacturing process, by performing micro adjustment to bring the thickness of the vibration region 46 of the piezoelectric vibrating element 100 to a predetermined thickness. In other words, the resonance frequency adjusting step may be conducted by adding a thickness to or reducing the thickness of the vibration region 46 of the piezoelectric vibrating element 100.

When the resonance frequency adjusting step is performed in the step of forming the metal film 50, for example, the film thickness of the metal film 50 may be micro-adjusted by increasing or reducing the thickness using, for example, dry etching, vapor deposition, sputtering or the like, whereby the thickness of the piezoelectric vibrating element 100 in the vibration region 46 is micro-adjusted to a predetermined thickness. If the resonance frequency adjusting step is performed in the step of forming the fluorocarbon resin film 60, for example, the film thickness of the fluorocarbon resin film 60 may be micro-adjusted by increasing or reducing the thickness using, for example, dry etching, vapor deposition, sputtering or the like, whereby the thickness of the piezoelectric vibrating element 100 in the vibration region 46 is micro-adjusted to a predetermined thickness.

The piezoelectric resonator 200 can be manufactured by using any one of the methods described above.

Next, although not shown, an IC component 70 is mounted in a predetermined region of the package body 10. The region for mounting the IC component 70 is not particularly limited, but may be mounted, for example, on the electrode pads 23 formed in the recessed section 2 of the package body so as to be electrically connected thereto (see FIG. 1A). Further, although not shown, when mounting the piezoelectric vibrating element 100 through the opening section 13, the IC component 70 may also be mounted in a predetermined region within the region 1a through the opening section 13.

The piezoelectric resonator 300 can be manufactured by any one of the methods described above.

The methods for manufacturing a piezoelectric resonator and a piezoelectric oscillator in accordance with the present embodiments have, for example, the following characteristics.

According to the method for manufacturing the piezoelectric resonator 200 in accordance with the present embodiment, piezoelectric resonators 200 each having the piezoelectric vibrating element 100 with long-term high reliability can be provided. Details thereof have been described above, and therefore are omitted here.

In consideration of the frequency lowering phenomenon that is caused by an increased mass due to adhesion of dimethylsiloxanes components generated from the silicone resin components of the bonding sections 30 to the piezoelectric vibrating element which would occur after manufacturing the piezoelectric resonator, a frequency stabilization process (aging process) for lowering and stabilizing the frequency may be conducted by applying heat treatment at 230° C.-270° C., for example, for a specified period of time. According to the method for manufacturing a piezoelectric resonator in accordance with the present embodiment, the fluorocarbon resin film 60 is formed such that adhesion of dimethylsiloxanes components generated from the bonding sections 30 to the piezoelectric vibrating element 100 can be prevented. Therefore, the frequency stabilization process that may be conducted during the period between manufacturing and shipping becomes unnecessary. In other words, by the method for manufacturing a piezoelectric resonator in accordance with the present embodiment, the productivity can be improved.

Also, as the heat treatment does not need to be conducted, the bonding sections 30 would not be deteriorated by heat. Also, as no heat treatment is necessary, no heat stress is caused in the IC component 70 in the frequency stabilization process, such that the reliability of the piezoelectric resonator 300 with the IC component 70 mounted thereon can be improved.

By the method for manufacturing a piezoelectric resonator in accordance with the present embodiment, piezoelectric resonators and piezoelectric oscillators having a long-term high reliability can be provided.

3. Experiment Examples

Experiment examples pertaining to the invention conceived by the inventor of the present application will be described with reference to FIGS. 6A-6E.

The inventor has been conducting studies on materials of protection films capable of preventing adhesion of dimethylsiloxanes to surfaces of piezoelectric resonators, in order to prevent the frequency lowering phenomenon with time. As a result, the inventor found that protection films composed of fluorocarbon resin having water repellent and oil repellent effect were effective in considerably suppressing chemical adsorption of evaporated dimethylsiloxanes through gas.

FIGS. 6A-6E are mass spectrum for explaining the dimethylsiloxanes adhesion prevention effect of fluorocarbon resin films. FIGS. 6A-6E show the results of mass spectrum of the surfaces used in the studies, measured by using time-of-flight secondary ion mass spectrometry (TOF-SIMS). Time-of-flight secondary ion mass spectrometry was conducted with TRIFT II manufactured by ULVAC-PHI, Inc. Analyzed depths of the time-of-flight secondary ion mass spectrometry were from the very outermost surface to about 1 nm in depth. By using the time-of-flight secondary ion mass spectrometry, micro concentration of organic components adhered to the surface of samples in the order of ppm can be detected.

In the studies, as Sample I, silicone rubber sheets that are capable of actively evaporating dimethylsiloxanes (KE-931-U manufactured by Sin-Etsu Silicones, Inc.) were used. As Sample II, silicon wafers were used. As Sample III, silicon wafers with fluorocarbon resin films formed thereon by a liquid phase method. As the material for the fluorocarbon resin films, fluoroether base resin (KY-130 manufactured by Sin-Etsu Chemical Co., Ltd.).

FIG. 6A shows mass spectrum of the surface of Sample I. More specifically, according to FIG. 6A, fragment signals of components originating from dimethylsiloxanes generated from the silicone rubber sheet were confirmed. More specifically, on the surface of Sample I, fragment signals (m/z=43, 73, 133, 147, 207, 221, 281) of Si (CH$_3$) O base components originated from dimethylsiloxanes, $^{28}$Si$^+$, $^{43}$SiCH$_3^+$, $^{73}$SiC$_3$H$_9^+$, $^{133}$Si$_2$O$_2$C$_5$H$_{15}^+$, $^{147}$Si$_2$OC$_5$H$_{15}^+$, $^{207}$Si$_3$O$_3$C$_5$H$_{15}^+$, $^{221}$Si$_3$O$_2$C$_7$H$_{21}^+$, $^{281}$Si$_4$O$_4$C$_7$H$_{21}^+$ were confirmed.

FIG. 6B shows mass spectrum of the surface of Sample II. According to FIG. 6B, fragment signals of components originating from a naturally oxidized film on the silicon wafer surface could be confirmed. More specifically, fragments signals of $^{28}$Si$^+$, $^{45}$SiOH$^+$(m/z=28, 45) were strongly detected.

FIG. 6C shows mass spectrum of the surface of Sample II that is placed in contact with Sample I. The contact condition in the studies was set such that Sample I was contacted onto Sample II, and this state was maintained for seven days at room temperature. As shown in FIG. 6C, on the surface of Sample II after contact, fragment signals (m/z=73, 147, 207, 221, 281) of Si (CH$_3$) O base components originated from dimethylsiloxanes component were confirmed. According to FIG. 6C, it was found that dimethylsiloxanes components originated from Sample I adhered to the silicon wafer surface of Sample II under the contact condition in the present studies.

FIG. 6D shows mass spectrum of the surface of Sample III. According to FIG. 6D, fragment signals of components originated from the fluorocarbon resin used were confirmed. More concretely, fragment signals of $^{12}$C$^+$, $^{31}$CF$^+$, $^{47}$CFO$^+$, $^{69}$CF$_3^+$, $^{100}$C$_2$F$_4^+$, $^{119}$C$_2$F$_5^+$, $^{163}$C$_3$O$_2$F$_5^+$, $^{185}$C$_3$OF$_7^+$, $^{213}$C$_4$O$_2$F$_7^+$(m/z=12, 31, 47, 69, 100, 119, 163, 185, 213) were strongly detected.

FIG. 6E shows mass spectrum of the surface of Sample III that was contacted with Sample I. The contact condition with respect to Sample III was the same as the contact condition with respect to Sample II, in which the contact condition was maintained for seven days at room temperature. As shown in FIG. 6E, on the surface of Sample III after having been contacted with Sample I, no fragment signal originated from dimethylsiloxanes components was confirmed, unlike Sample II, and the result that is the same as the result of mass spectrum of Sample III before contacting with Sample I was obtained.

From the results described above, the inventor discovered that fluorocarbon resins and dimethylsiloxanes components have extremely low affinity, and protection films composed of fluorocarbon resin were effective in considerably suppressing chemical adsorption of evaporated dimethylsiloxanes through gas.

4. Electronic Apparatus

Figure 7:
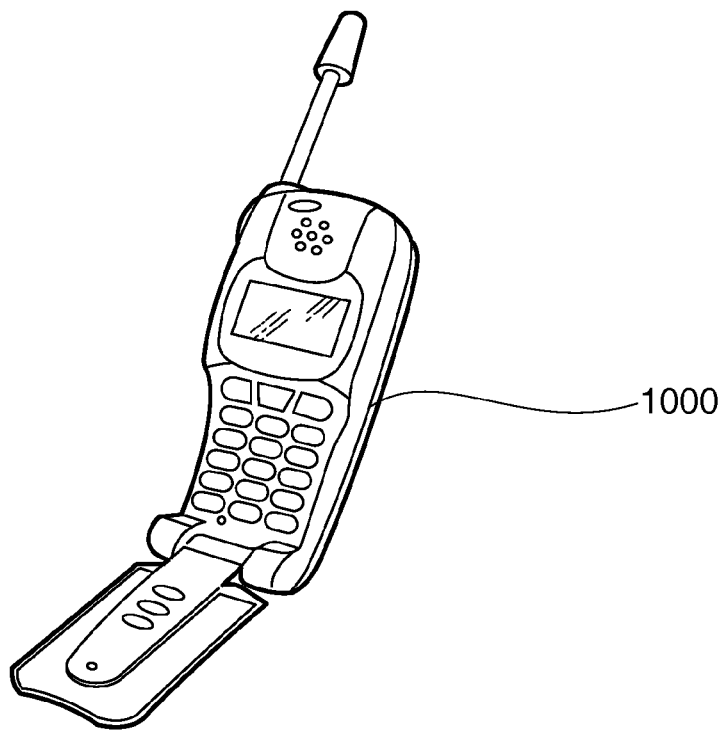
FIG. 7 schematically shows an example of an electronic apparatus in accordance with an embodiment of the invention.

Next, an electronic apparatus 1000 in accordance with an embodiment of the invention will be described. The electronic apparatus 1000 has the piezoelectric resonator 200 in accordance with the present embodiment. The electronic apparatus 1000 may be any of electronic apparatuses, such as, for example, cellular phones, automobile devices, digital cameras, projectors, cellular phone stations, digital TV, digital video cameras, watches, portable digital music players, PDA, personal computers, printers and the like. For example, as shown in FIG. 7A, when the electronic apparatus 1000 is a cellular phone, the piezoelectric resonator 200 in accordance with the present invention can be used as a temperature compensation quartz oscillator of a wireless circuit and a GPS circuits. Also, the piezoelectric resonator 200 in accordance with the present invention can be used for motion sensing, such as, the motion detection function of cameras. Also the piezoelectric resonator 200 in accordance with the present invention can be used as a voltage compensation type quartz oscillator for reception of one-segment broadcasting.

According to the electronic apparatus in accordance with the present embodiment described above, a electronic apparatus 1000 having the piezoelectric resonator 200 and/or the piezoelectric oscillator 300 having a long-term high reliability can be provided.

Embodiments of the invention have been described above in details. However, it should be readily understood by a person having ordinary skill in the art that many modifications can be made without departing in substance from the novel matter and the effects of the invention. Accordingly, all of such modification examples are deeded to be included in the scope of the invention.

What is claimed is:

1. A piezoelectric resonator comprising:
a package having a cavity;
a plurality of electrode pads disposed within the cavity;
a first bonding section disposed on one of the plurality of electrode pads;
a second bonding section disposed on another one of the plurality of electrode pads; and
a piezoelectric vibrating element having one end supported by the first bonding section and the second bonding section,
the piezoelectric vibrating element having:
a first face;
a second face mutually opposed to the first face;
a first electrode disposed on the first face, the first electrode electrically connecting to the first bonding section; and
a second electrode disposed on the second face, the second electrode electrically connecting to the second bonding section;
an area of the piezoelectric vibrating element supported by the first bonding section and the second bonding section defining a supported region, an area of the piezoelectric vibrating element that is not supported by the first bonding section or the second bonding section defining a movable region;
the first bonding section and the second bonding section including a first compound that has a siloxane bond; and
a fluorocarbon resin film being disposed on the movable region, the fluorocarbon resin film preventing adhesion of a second compound that has a siloxane bond, the second compound being generated from the first compound.

2. A piezoelectric resonator according to claim 1, wherein the piezoelectric vibrating element includes a piezoelectric substrate, the piezoelectric substrate being a quartz substrate.

3. A piezoelectric resonator according to claim 1, wherein the fluorocarbon resin film is formed, within the movable region, in a manner to cover at least a region where the piezoelectric vibrating element vibrates.

4. A piezoelectric resonator according to claim 1, wherein the fluorocarbon resin film is formed, within the movable region, in a manner to cover at least the first electrode and the second electrode.

5. A piezoelectric resonator according to claim 1, wherein the piezoelectric vibrating element has a predetermined first resonance frequency, and has a second resonance frequency lower by a predetermined frequency than the first resonance frequency as a result of forming the fluorocarbon resin film having a predetermined film thickness in a predetermined region of the piezoelectric vibrating element.

6. A piezoelectric resonator according to claim 1, wherein the fluorocarbon resin film is formed from fluorocarbon resin material having water repellent property and oil repellent property.

7. A piezoelectric resonator according to claim 1, wherein the fluorocarbon resin film is formed from a fluoropolyether base material.

8. A piezoelectric oscillator comprising the piezoelectric resonator recited in claim 1 and an oscillation circuit electrically connected thereto.

9. An electronic apparatus comprising the piezoelectric resonator recited in claim 1.

10. A piezoelectric resonator comprising:
a piezoelectric vibrating element that has a supported region located at one end of the piezoelectric vibrating element, and that has a movable region; and
an adhesive including a first compound that has a siloxane bond,
a fluorocarbon resin being disposed on the movable region, the fluorocarbon resin film preventing adhesion of a second compound that has a siloxane bond, the second compound being generated from the first compound.

11. The piezoelectric resonator according to claim 10, further comprising:
a package that surrounds the piezoelectric vibrating element and the adhesive.

12. The piezoelectric resonator according to claim 10, the adhesive electrically connecting an electrode of the piezoelectric vibrating element and an electrode pad of the piezoelectric resonator, the adhesive being mounted on the supported region.

13. The piezoelectric resonator according to claim 1, the first compound including silicone.

14. The piezoelectric resonator according to claim 13, the second compound including dimethylsiloxane.

15. The piezoelectric resonator according to claim 10, the first compound including silicone.

16. The piezoelectric resonator according to claim 15, the second compound including dimethylsiloxane.

* * * * *